(12) United States Patent
Lu et al.

(10) Patent No.: US 6,787,429 B2
(45) Date of Patent: Sep. 7, 2004

(54) HIGH-K DIELECTRIC MATERIALS AND PROCESSES FOR MANUFACTURING THEM

(75) Inventors: Jiong-Ping Lu, Dallas, TX (US); Ming-Jang Hwang, Dallas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/188,682

(22) Filed: Jul. 2, 2002

(65) Prior Publication Data

US 2002/0177268 A1 Nov. 28, 2002

Related U.S. Application Data

(63) Continuation of application No. 09/651,475, filed on Aug. 30, 2000, now Pat. No. 6,451,646.

(51) Int. Cl.$^7$ .............................................. H01L 21/20
(52) U.S. Cl. ................................... 438/393; 438/239
(58) Field of Search ............................. 438/239, 240, 438/253, 381, 383, 393, 396, 657, 663, 680, 770, 773

(56) References Cited

U.S. PATENT DOCUMENTS

| | | |
|---|---|---|
| 4,152,490 A | 5/1979 | Witzke |
| 4,585,312 A | 4/1986 | Ishiwata et al. |
| 5,189,503 A | 2/1993 | Suguro et al. |
| 5,195,018 A | 3/1993 | Kwon et al. |
| 5,225,286 A | 7/1993 | Fujikawa et al. |
| 5,290,609 A | 3/1994 | Horiike et al. |
| 5,362,632 A * | 11/1994 | Mathews .................. 438/239 |
| 5,387,480 A | 2/1995 | Haluska et al. |
| 5,589,733 A | 12/1996 | Noda et al. |
| 5,719,425 A | 2/1998 | Akram et al. |
| 5,719,607 A | 2/1998 | Hasegawa et al. |
| 5,793,057 A | 8/1998 | Summerfelt |
| 5,841,186 A | 11/1998 | Sun et al. |
| 5,859,760 A | 1/1999 | Park et al. |
| 5,866,460 A | 2/1999 | Akram et al. |
| 5,910,880 A | 6/1999 | DeBoer et al. |
| 5,981,333 A | 11/1999 | Parekh et al. |
| 5,981,350 A | 11/1999 | Geusic et al. |
| 5,985,714 A | 11/1999 | Sandhu et al. |
| 5,985,732 A | 11/1999 | Fazan et al. |
| 6,204,203 B1 | 3/2001 | Narwankar et al. |
| 6,207,561 B1 | 3/2001 | Hwang et al. |
| 6,215,650 B1 | 4/2001 | Gnade et al. |
| 6,218,256 B1 * | 4/2001 | Agarwal ..................... 438/393 |
| 6,248,640 B1 | 6/2001 | Nam |
| 6,265,260 B1 | 7/2001 | Alers et al. |
| 6,284,655 B1 | 9/2001 | Marsh |
| 6,303,426 B1 | 10/2001 | Alers |
| 6,339,009 B1 | 1/2002 | Lee et al. |
| 6,352,865 B2 | 3/2002 | Lee et al. |
| 6,362,068 B1 | 3/2002 | Summerfelt et al. |
| 6,387,749 B1 | 5/2002 | Lim |
| 6,403,415 B1 | 6/2002 | Alers et al. |
| 6,448,128 B1 | 9/2002 | Lee et al. |
| 6,451,646 B1 * | 9/2002 | Lu et al. .................... 438/239 |
| 6,541,330 B1 | 4/2003 | Lee et al. |
| 6,548,368 B1 | 4/2003 | Narwankar et al. |
| 2002/0164883 A1 | 11/2002 | Murphy |

OTHER PUBLICATIONS

Kamada et al., "Structure and Properties of Silicon Titanium Oxide Films Prepared by Plasma–Enhanced Chemical Vapor Deposition Method", Japanese Journal of Applied Physics, vol. 30, No. 12B, Dec. 1991, pp. 3594–3596.

* cited by examiner

Primary Examiner—David Nhu
(74) Attorney, Agent, or Firm—TraskBritt PC

(57) ABSTRACT

High dielectric films of mixed transition metal oxides of titanium and tungsten, or titanium and tantalum, are formed by sequential chemical vapor deposition (CVD) of the respective nitrides and annealing in the presence of oxygen to densify and oxidize the nitrides. The resulting film is useful as a capacitative cell and resists oxygen diffusion to the underlying material, has high capacitance and low current leakage.

16 Claims, 4 Drawing Sheets

HIGH-K DIELECTRIC MATERIALS AND PROCESSES FOR MANUFACTURING THEM

CROSS-REFERENCE TO RELATED APPLICATION

This application is a continuation of application Ser. No. 09/651,475, filed Aug. 30, 2000, now U.S. Pat. No. 6,451,646, issued Sep. 17, 2002.

BACKGROUND OF THE INVENTION

1. Field of the Invention

This invention relates generally to semiconductor devices. More particularly, the invention pertains to materials with high dielectric constants and methods for incorporating them in semiconductor devices.

2. State of the Art

In the manufacture and use of integrated circuit (IC) devices, new applications continually drive the development of devices with enhanced miniaturization and increased circuit density. Current and future developments in reducing the size of dynamic random access memory (DRAM) devices and the like result in a need for storage capacitor materials having higher dielectric constants than currently available.

Capacitor cells are generally formed as "stacked" capacitors, i.e., positioned above the working surface of the chip or wafer, or "trench" capacitors, which are formed in a trench in the wafer or chip substrate. Because of the need to make the best use of available space in a device, current capacitor designs include non-planar structures which may be formed in various configurations. References which describe examples of non-planar capacitor constructions include U.S. Pat. No. 5,981,333 to Parekh et al., U.S. Pat. No. 5,981,350 to Geusic et al., U.S. Pat. No. 5,985,714 to Sandhu et al., and U.S. Pat. No. 5,985,732 to Fazan et al., each of which is incorporated herein by reference.

The number of high dielectric materials from which capacitor cells may be satisfactorily formed is limited. Insulating inorganic metal oxide materials such as ferroelectric or perovskite material have high dielectric constants and generally low leakage current. However, these materials require a step of "oxidation-densification" to produce the desired dielectric capacitor layer. Unfortunately, such oxidation-densification undesirably oxidizes the underlying electrode of conductively doped polysilicon. As practiced currently, an intervening oxygen-barrier layer is placed between the electrode and dielectric material. The barrier layer must be electrically conductive, inasmuch as the underlying polysilicon must be in electrical connection with the dielectric layer. The materials which may be used as oxygen barrier layers are limited in number. Elemental platinum on polysilicon has been suggested as a barrier layer for a lower capacitor plate but undergoes physical degradation with thermal cycling due to silicon diffusion through the platinum. Sputtered TiN and CVD-applied TiN have been known to fail due to diffusion along grain boundaries.

As known in the art, an alloy of titanium and tungsten may be used as a barrier layer between a silicon layer and an aluminum ohmic contact, where the junction is very shallow, i.e., less than about 0.2 $\mu$m.

In U.S. Pat. No. 5,985,714 having patentees of Sandhu et al. and of even assignment with this application, a condenser construction is described which uses a wide variety of dielectric materials including titanates of barium; barium and strontium; strontium; lead; barium and lead; lead and zirconium; lead and lanthanum; lead and lanthanum and zirconium; and bismuth. Lithium tantalate is also mentioned.

Several materials which have been used or undergone evaluation include $Ta_2O_5$ and $(Ba, Sr)TiO_3$, the latter commonly known as BST. $Ta_2O_5$ has a dielectric constant k which is about 15 to 25; the dielectric constant is too low to meet the requirements for use in advanced DRAM and other semiconductor construction, i.e., a much higher dielectric constant generally exceeding about 100.

BST materials have dielectric constants, i.e., about 300–600, which are higher than dielectric materials in current use. However, the processes for producing BST are not yet fully developed. The processing of BST is intrinsically difficult because of the low volatility of the precursors used in the chemical vapor deposition (CVD) step, and by difficulty in controlling the complex stoichiometry to maintain the desired material characteristics.

Alternative dielectric materials have appeared to offer potential advantages in dielectric constant value and ease of manufacture. For example, $TiO_2$ films are well known as high dielectric materials. $TiO_2$ films have a dielectric constant greater than 100, which is considerably higher than that of $Ta_2O_5$. In addition, $TiO_2$ films may be formed using current manufacturing methods. However, it has been found that capacitors made of pure $TiO_2$ have a high leakage current unacceptable in high-density devices required by current and developing electronic technology.

It has been shown by Matsushita (Jpn. J. Appl. Phys. 30 (1991) 3594) that doping $TiO_2$ with $SiO_2$ may dramatically improve the leakage current of the $TiO_2$ materials used in capacitors. However, this doped material is generally comparable to $Ta_2O_5$ in dielectric constant, i.e., in a low range of about 15–25.

Other materials considered for high dielectric use include tungsten trioxide ($WO_3$) but it has an unacceptably high leakage current.

Commercial production of semiconductor devices requires a sequence of basic physical/chemical processes, many of which are typically performed on a large number of dice in a semiconductor wafer prior to singulating and packaging the devices. The minimal time required to carry out the process from beginning to end is extensive, with high attendant cost. For example, it usually takes about 6–8 weeks or more to produce a potentially finished memory chip from an uncut multi-wafer crystal. It is desirable to shorten the processing time as much as possible, to reduce manpower cost and increase the throughput rate of processing equipment.

The instant invention addresses the need for new dielectric materials having high dielectric constants (K) of about 100 or more, and the capability of being processed more quickly, easily and precisely, and at lower cost than other high dielectric material candidates.

BRIEF SUMMARY OF THE INVENTION

In accordance with the invention, dielectric materials are presented which have dielectric constants greater than either $Ta_2O_5$ or $SiO_2$-doped $TiO_2$, have low leakage current, and may be prepared using cost-effective deposition and annealing processes.

In this invention, materials for use in making integrated circuit devices are formed of the oxides of mixed transition metals such as titanium plus tungsten, or titanium plus tantalum. To form a capacitative cell, the transition metals are deposited on a conductive plate (electrode) such as doped polysilicon, and annealed and oxidized under controlled conditions. The resulting materials have a dielectric constant k greater than either $Ta_2O_5$ or $SiO_2$-doped $TiO_2$, and an oxygen barrier is integrally formed to prevent oxidation of the underlying doped polysilicon.

These new materials may be readily prepared through a chemical vapor deposition (CVD) process, which provides excellent conformality, an important advantage in the manufacture of capacitor cells with non-planar structures. Unlike the problems in preparing BST, all precursors used for deposition of the new materials by CVD are volatile and easily used. Use of the high dielectric materials to form capacitor cells enables further density increases in DRAM and other devices.

The high dielectric materials presented herein may be readily used to produce capacitative structures ranging from simple two-plate cells to multi-plate stacked non-planar cells.

BRIEF DESCRIPTION OF THE DRAWINGS

The following drawings illustrate various embodiments of the invention, not necessarily to scale, wherein.

DESCRIPTION OF THE ILLUSTRATED EMBODIMENTS

A new type of semiconductor material comprises mixed transition metal oxides such as Ti—W—O or Ti—Ta—O. These materials may be easily and readily prepared as thin layers using a Chemical Vapor Deposition (CVD) process followed by an annealing-oxidation step to densify the layers into a film with high dielectric constant, typically >100, low leakage current, and high resistance to the passage of oxygen therethrough to an underlying silicon electrode or plate.

In a first embodiment, a method of forming a high dielectric semiconductor film in a capacitor cell on a substrate 8 or other layer thereon in accordance with the invention is shown by example in drawing FIGS. 1 through 5. The material upon which the capacitor cell is to be formed will be referred to herein as substrate 8, regardless of its physical/chemical characteristics or purpose. Sub-steps such as lithographic mask formation and etching to remove portions of applied layers and define the outlines of the capacitative cell are not described, being well known in the art.

Figure 1:
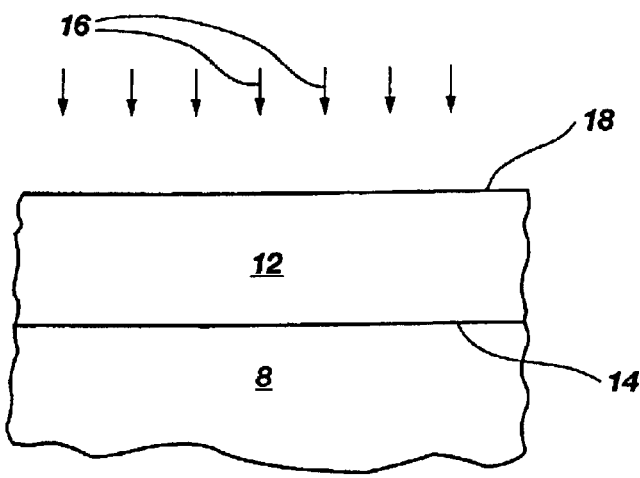
FIG. 1 is a cross-sectional side view of a portion of a semiconductor device at a processing step in the preparation of a high dielectric constant material in accordance with a method of the invention.

To create a capacitor cell, a first or lower conductive "plate" or electrode 12 is formed on an exposed surface 14 of the substrate 8, as depicted in drawing FIG. 1. The lower plate 12 (also referred to herein as "polysilicon layer or plate 12") is typically formed by depositing and doping polysilicon on the wafer substrate 8. The deposition may be by low pressure chemical vapor deposition (LPCVD) from a gaseous chemical precursor 16 such as silane gas ($SiH_4$) plus an inert carrier gas. Other precursors 16 may alternatively be utilized. Methods other than chemical vapor deposition may be used, but LPCVD is a preferred method. The polysilicon layer 12 may be conductively doped by diffusion or by implantation following polysilicon deposition, or by other doping methods. Typical dopant precursors commonly used to increase the conductivity of the polysilicon layer 12 include diborane, phosphine, and/or arsine, by which boron, phosphorus, or arsenic, respectively, becomes entrapped in the grain boundaries of the polysilicon.

Polysilicon deposition by LPCVD may be conducted in a horizontal flow, hot wall apparatus. Instead of a diluent gas, the use of low pressures (0.1–1.0 torr) reduces nucleation within the silicon-containing gas phase. The doped polysilicon layer comprising lower plate 12 is typically annealed at about 600° C. to further crystallize the film.

A high dielectric film 10 of a capacitative apparatus having oxygen barrier properties and low current leakage is then formed on the lower plate 12 by subsequent steps illustrated in drawing FIGS. 2 through 5. The exemplary capacitative cell is a simple, planar, 2-plate capacitor, and illustrates the method and resulting product irrespective of configuration, complexity, or non-planarity of the desired capacitor.

Figure 2:
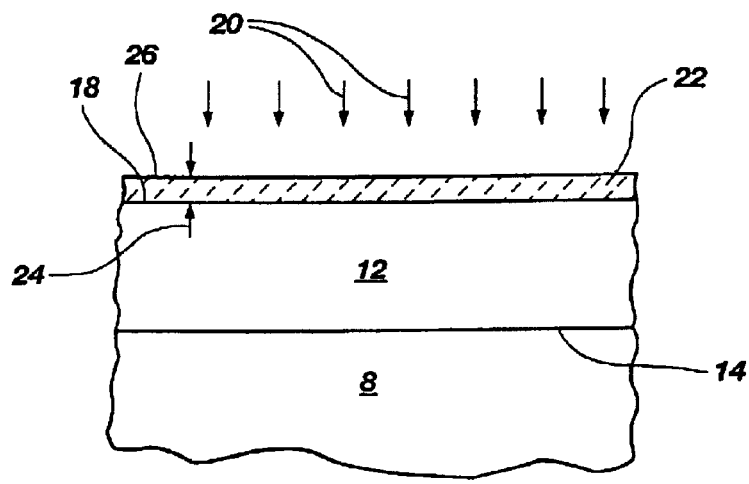
FIG. 2 is a cross-sectional side view of a portion of a semiconductor device at a processing step further to the step shown in FIG. 1 in the preparation of a high dielectric constant material in accordance with a method of the invention.

As shown in drawing FIG. 2, a thin layer 22 of tungsten nitride $WN_x$ is first deposited on surface 18 of lower plate 12. Preferably, the $WN_x$ is deposited by a chemical vapor deposition (CVD) process from gaseous precursor 20 comprising $WF_6+NH_3$, $W(CO)_6+N_2+H_2$ at a temperature in the range of about 300° C. to about 700° C. The required thickness 24 of $WN_x$ layer 22 is minimal, and may be about, e.g., in the range of about 30 to about 300 Angstroms. The CVD process permits a very conformal layer 22 of tungsten to be formed; i.e., good step coverage is achieved. The process is very controllable to produce a uniform layer 22 of controllable thickness 24.

Figure 3:
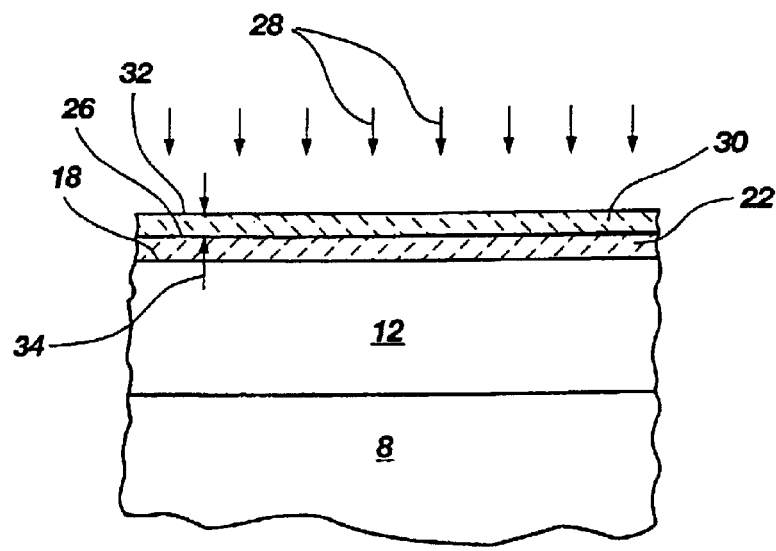
FIG. 3 is a cross-sectional side view of a portion of a semiconductor device at a processing step further to the step shown in FIG. 2 in the preparation of a high dielectric constant material in accordance with a method of the invention.

In a further step shown in FIG. 3, a thin layer 30 of titanium nitride TiN is deposited upon upper surface 26 of $WN_x$ layer 22. Again, the CVD method is preferred, wherein deposition occurs from a precursor stream 28 such as $TiCl_4+NH_3$, $TiBr_4+NH_3$, $TiI_4+NH_3$ or $Ti(NRR')_4$ where the R and R' represent alkyl groups. A deposition temperature in the range of about 300° C. to about 700° C. is used. Like the deposition of tungsten nitride, the CVD method of depositing titanium provides a very conformal upper surface 32, enabling the formation of capacitors on very non-planar surfaces with uniform controllable thickness 34. A uniform layer thickness 34 varying from about 30 to about 300 Angstroms may be readily formed.

Alternatively, the TiN layer 30 may be formed by another method, such as sputtering, evaporation, or thermal nitridation of a Ti layer at above 600° C. However, none of these processes is as effective as CVD.

Following deposition of the tungsten nitride layer 22 and the titanium nitride layer 30 on the polysilicon plate 12, the layers are then subjected to an annealing step wherein the layers are oxidized and densified to form the desired high dielectric film 10. The oxidation is accomplished by exposure to NO, $N_2O$, or other oxygen-containing gas during the annealing step, at a temperature of about 700° C., but within the range of about 600° C. to about 900° C. for a period of about two (2) minutes.

Figure 4:
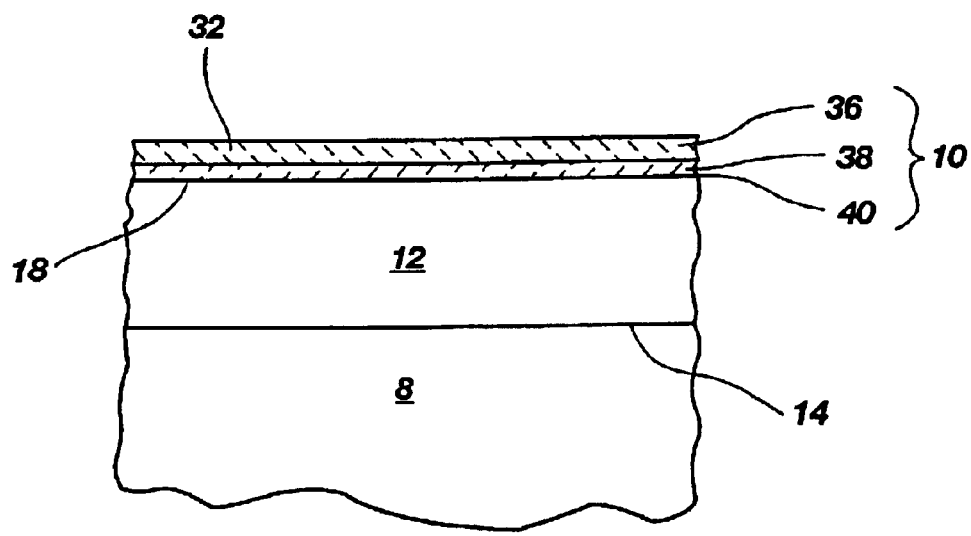
FIG. 4 is a cross-sectional side view of a portion of a semiconductor device at a processing step further to the step shown in FIG. 3 in the preparation of a high dielectric constant material in accordance with a method of the invention.

As indicated in drawing FIG. 4, the resulting densified and oxidized dielectric film 10 has an upper stratum 36 comprising $TiO_2$ with some $WO_2$ and $WO_3$ present. Below the upper stratum 36 is lower stratum 38, comprised primarily of a very thin layer of $WO_2$ and $WO_3$, which acts as a barrier to the passage of oxygen into the underlying polysilicon layer 12. There is a certain degree of intermixing of the metal oxides of the upper and lower stratums 36, 38. It is believed that the interface 40 between the lower stratum 38 and the polysilicon layer 12, i.e., along plate surface 18, comprises primarily nitrides and silicides of tungsten, with a very small amount of oxides, which is an excellent diffusion barrier to prevent further reaction between the lower plate 12 and the lower stratum 38. The high dielectric film 10 of the invention is considered to include the upper stratum 36, lower stratum 38 and interface 40.

Figure 5:
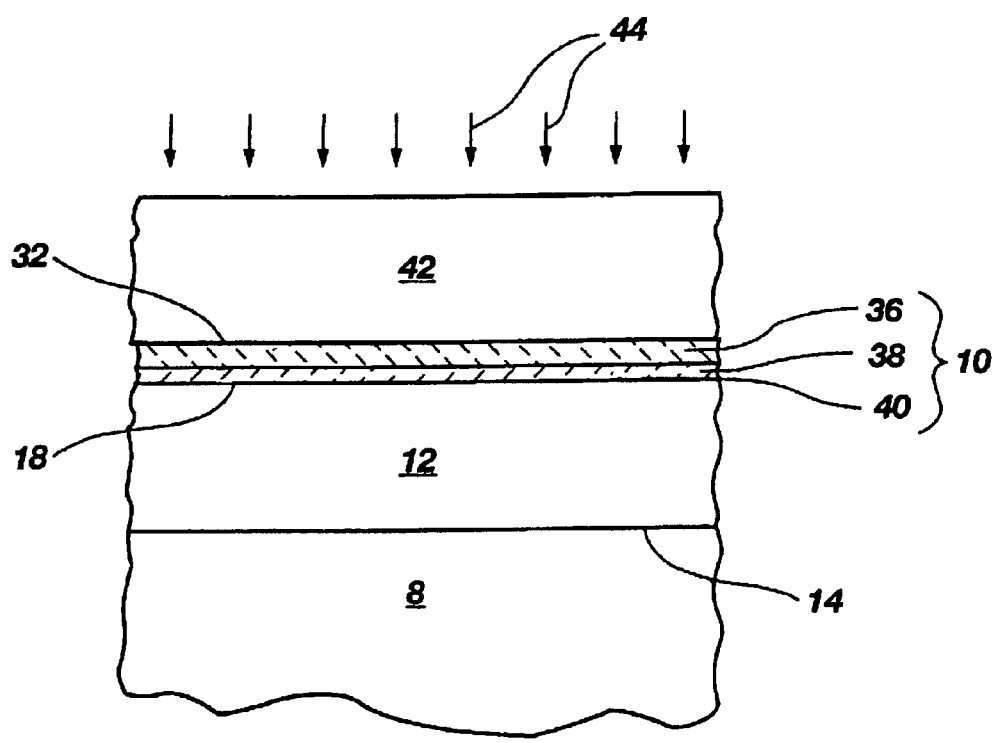
FIG. 5 is a cross-sectional side view of a portion of a semiconductor device at a processing step further to that shown in FIG. 4 in the preparation of a high dielectric constant material in accordance with a method of the invention.

As depicted in drawing FIG. 5, an upper conductive plate 42 may then be formed on the upper surface 32 of the high dielectric film 10. The upper plate may comprise CVD-applied or sputter-applied polysilicon 44 with a conductive dopant, for example, or may even comprise metallization.

Figure 6:
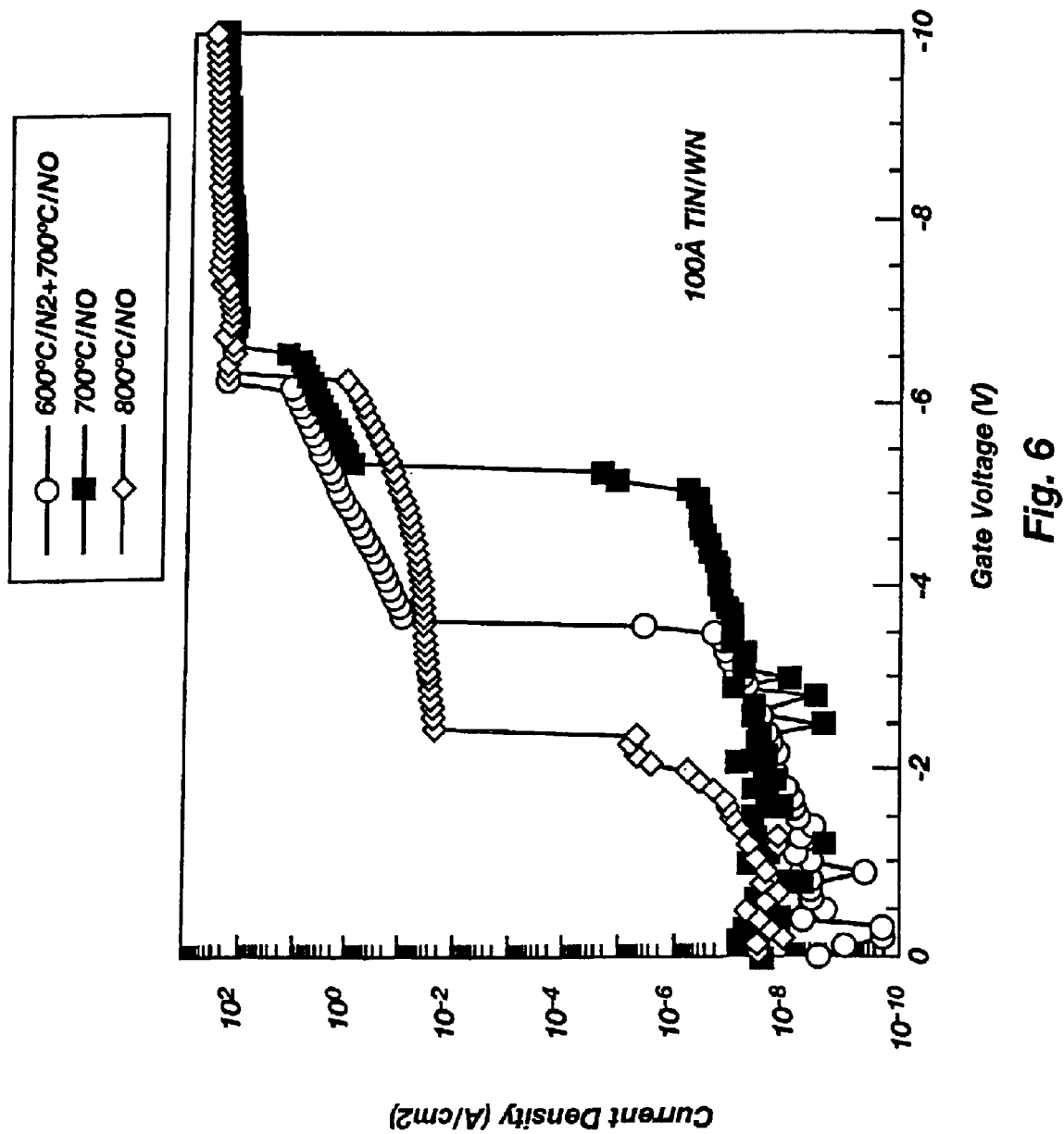
FIG. 6 is the graphical output of a current density test of a 100 Angstrom film of a mixed TiN and WN composition in accordance with the invention.
Figure 7:
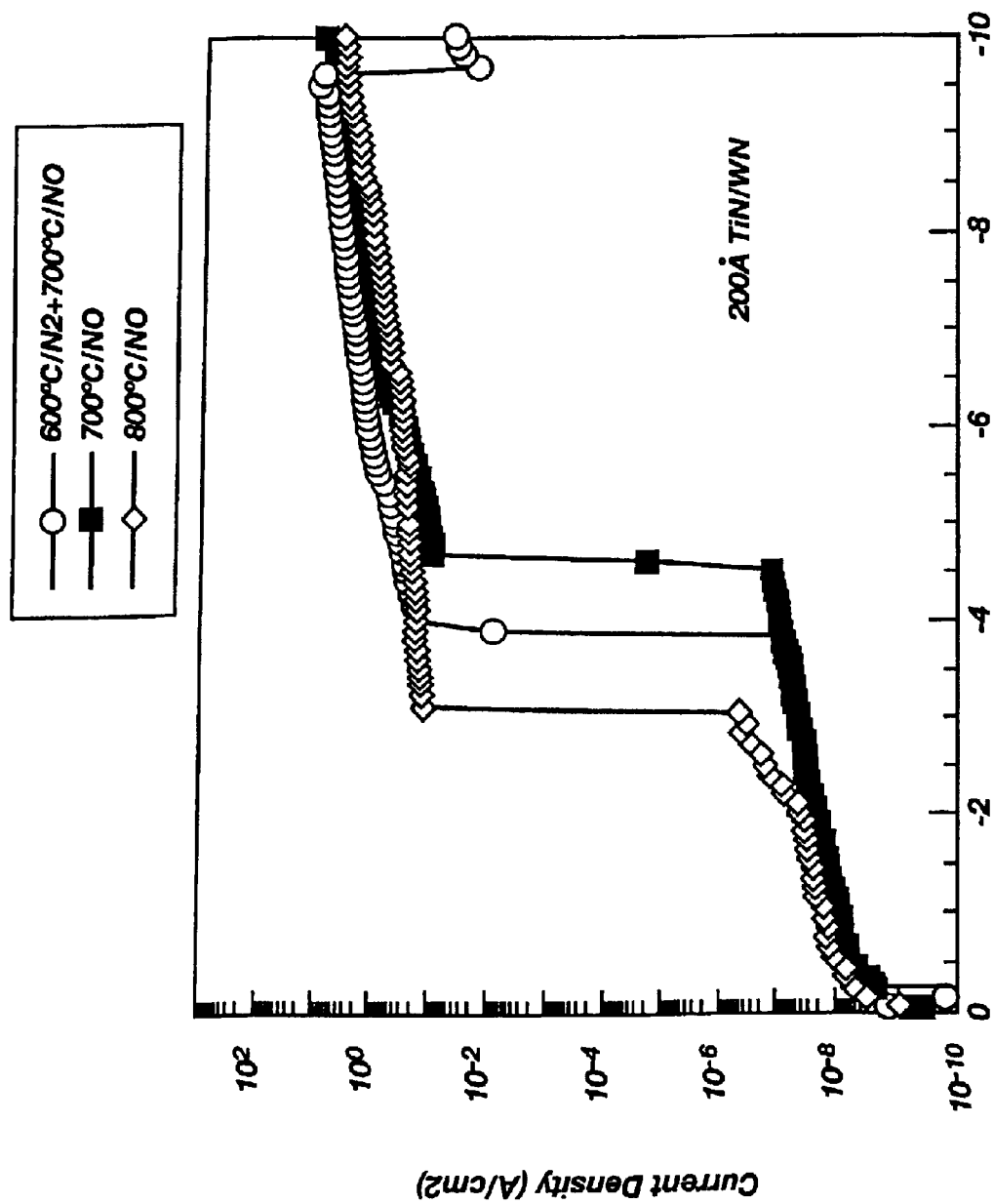
FIG. 7 is the graphical output of a current density test of a 200 Angstrom film of a mixed TiN and WN composition in accordance with the invention.

In several tests, the leakage current density (amperes/square cm.) was determined as a function of gate voltage for films formed in accordance with the invention. Data was collected for titanium nitride/tungsten nitride films of 100 Angstroms and 200 Angstroms thickness, using three different annealing conditions. The results appear in drawing FIGS. 6 and 7, and show a very low current leakage when compared to pure $TiO_2$ or $WO_3$.

While drawing FIGS. 1 through 5 depict a preferred method of the invention, variations thereof may be used. Thus, in a further embodiment of the invention, the sequence of layer deposition may be changed.

In one embodiment, titanium nitride may be deposited prior to the deposition of tungsten nitride; the resulting high dielectric film 10 will have its strata in the reverse order from that shown in drawing FIGS. 2 through 5.

In a further embodiment of reverse order deposition, tungsten nitride may be replaced by elemental tungsten W as the deposited metal layer in the CVD process. The deposition temperature of W will be about 500° C. using $WF_6+H_2$ as the precursor gas.

In another embodiment, the mixture of transition metal oxides forming the high dielectric layer comprises titanium dioxide $TiO_2$ and tantalum oxide $Ta_xO_y$, the latter primarily $Ta_2O_5$. Preferably, the metal oxides are deposited by CVD from tantalum nitride and titanium nitride, in that order. The CVD deposition of tantalum nitride may be conducted at a temperature of about 600° C., using $TaBr+NH_3$ as a diluent gas.

As described, new high dielectric structures, and methods for forming them and constructing capacitors therefrom have advantages over the prior art. Each of the fabrication steps is conducted using a well-developed process which, for the particular materials, is reliable, easy to perform and cost effective. The process equipment items, i.e., CVD reactors, are commercially available and comprise a major component in chip manufacturing equipment.

What is claimed is:

1. A method for forming a capacitor having a first electrode and a second electrode comprising:
    providing a first transition metal nitride layer contacting said first electrode, said first layer comprising one of tungsten nitride and tantalum nitride;
    providing a second transition metal nitride layer contacting said first layer, said second layer comprising titanium nitride and having an exposed surface;
    annealing said exposed surface of said second layer in the presence of oxygen for increasing a density of said second layer and for oxidizing at least said second layer; and
    forming said second electrode over said annealed second layer.

2. The method of claim 1, wherein said first layer is deposited by chemical vapor deposition from a gas stream containing precursors for one of tungsten nitride and tantalum nitride.

3. The method of claim 2, wherein said gas stream contains a diluent comprising one of $WF_6+NH_3$, $W(CO)_6+NH_3$, $TaCl_5+NH_3$, and $TaBr_5+NH_3$.

4. The method of claim 1, wherein said second layer is deposited by chemical vapor deposition from a gas stream containing precursors for titanium nitride.

5. The method of claim 4, wherein said gas stream contains a diluent comprising one of $TiCl_4+NH_3$, $TiBr_4+NH_3$, and $Ti(NRR')_4$ where R and R' represent alkyl groups.

6. The method of claim 1, wherein said first and second electrodes comprise conductively doped polysilicon.

7. A method for forming a capacitor having a first electrode and a second electrode comprising:
    providing a first transition metal nitride layer contacting said first electrode, said first layer comprising titanium nitride;
    providing a second transition metal nitride layer contacting said first layer, said second layer comprising one of tungsten nitride and tantalum nitride, said second layer having an exposed surface;
    annealing said exposed surface of said second layer in the presence of oxygen for increasing a density of said second layer and for oxidizing at least said second layer; and
    forming said second electrode over said annealed second layer.

8. The method of claim 7, wherein said first layer is deposited by chemical vapor deposition from a gas stream containing precursors for titanium nitride.

9. The method of claim 8, wherein said second layer is deposited by chemical vapor deposition from a gas stream containing precursors for one of tungsten nitride and tantalum nitride.

10. The method of claim 7, wherein said first and second electrodes comprise conductively doped polysilicon.

11. A method for forming a capacitor having a first electrode and a second electrode comprising:

provide a first transition metal nitride layer contacting said first electrode, said first layer comprising titanium nitride;

providing a second transition metal layer contacting said first layer, said second layer comprising elemental tungsten, said second layer having an exposed surface;

annealing said exposed surface of said second layer in the presence of oxygen for increasing a density of said second layer and for oxidizing said first and second layers; and forming said second electrode over said annealed second layer.

12. The method of claim 11, wherein said first layer is deposited by chemical vapor deposition from a gas stream containing precursors for titanium nitride.

13. The method of claim 11, wherein said second layer is deposited by chemical vapor deposition from a gas stream containing precursors for elemental tungsten.

14. The method of claim 13, wherein said gas stream containing precursors for elemental tungsten includes a diluent gas comprising one of $WF_6+NH_3$ and $W(CO)_6+NH_3$.

15. The method of claim 12, wherein said first and second electrodes comprise conductively doped polysilicon.

16. A method of making a member in contact with a first electrode having high dielectric constant low current leakage and low oxygen diffusion therethrough to an underlying substrate, said method comprising:

forming a first layer of one of refractory metal oxide and refractory metal nitride, said first layer contacting said first electrode;

forming a second layer of titanium nitride; and annealing said first layer and said second layer at elevated temperature in the presence of oxygen for increasing a density of said second layer and for oxidizing at least said second layer.

* * * * *